United States Patent
Migita et al.

(10) Patent No.: US 9,846,200 B2
(45) Date of Patent: Dec. 19, 2017

(54) BATTERY STATE ESTIMATION DEVICE AND STORAGE BATTERY SYSTEM

(71) Applicant: Sanyo Electric Co., Ltd., Osaka (JP)

(72) Inventors: Naoto Migita, Osaka (JP); Yohei Ishii, Osaka (JP); Akihiko Yamada, Osaka (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 325 days.

(21) Appl. No.: 14/428,665

(22) PCT Filed: Sep. 24, 2013

(86) PCT No.: PCT/JP2013/005628
§ 371 (c)(1),
(2) Date: Mar. 17, 2015

(87) PCT Pub. No.: WO2014/050073
PCT Pub. Date: Apr. 3, 2014

(65) Prior Publication Data
US 2015/0234013 A1 Aug. 20, 2015

(30) Foreign Application Priority Data
Sep. 26, 2012 (JP) .................................. 2012-211933

(51) Int. Cl.
*G01R 31/36* (2006.01)
(52) U.S. Cl.
CPC ..... *G01R 31/3648* (2013.01); *G01R 31/3606* (2013.01)
(58) Field of Classification Search
CPC .................. G01R 31/3648; G01R 31/3606
See application file for complete search history.

(56) References Cited

U.S. PATENT DOCUMENTS

| 2002/0113594 A1* | 8/2002 | Satake | G01R 31/3637 |
| | | | 324/427 |
| 2003/0169049 A1* | 9/2003 | Kawaguchi | B60L 11/1851 |
| | | | 324/426 |

(Continued)

FOREIGN PATENT DOCUMENTS

| JP | 2004-109007 | 4/2004 |
| JP | 2008-145199 | 6/2008 |

(Continued)

OTHER PUBLICATIONS

International Search Report of PCT application No. PCT/JP2013/005628 dated Nov. 5, 2013.

*Primary Examiner* — Khamdan Alrobaie
(74) *Attorney, Agent, or Firm* — McDermott Will & Emery LLP

(57) ABSTRACT

After charging or discharging is stopped, a reference timing ($t_0$) is set, and a first timing ($t_1$) at which battery voltage (V) changes by a unit amount (N) with respect to the reference timing ($t_0$), and a second timing ($t_2$) at which the battery voltage changes by twice more than the unit amount with respect to the reference timing ($t_0$) are select and set. The ratio of the time difference ($t_2-t_1$) between the first and the second timing to the time difference ($t_1-t_0$) between the reference and the first timing is found as a voltage change parameter (R) corresponding to the rate of change of the change speed of the voltage battery. An estimation device considers the change rate determined by the parameter is considered to be unchanged during an electrical current non-passage, and estimates a stable open circuit voltage at an object timing in future after the second timing.

7 Claims, 13 Drawing Sheets

(56) References Cited

U.S. PATENT DOCUMENTS

| | | | |
|---|---|---|---|
| 2009/0030626 A1 | 1/2009 | Iwane et al. | |
| 2014/0167656 A1* | 6/2014 | Yamada | G01R 31/3624 318/139 |
| 2014/0368208 A1* | 12/2014 | Yamada | H01M 10/48 324/433 |
| 2015/0054449 A1* | 2/2015 | Takano | H01M 10/443 320/107 |

FOREIGN PATENT DOCUMENTS

| | | |
|---|---|---|
| JP | 2008-256436 | 10/2008 |
| WO | 2006/129802 | 12/2006 |

* cited by examiner

BATTERY STATE ESTIMATION DEVICE AND STORAGE BATTERY SYSTEM

TECHNICAL FIELD

The present invention is related to a battery state estimation device and a storage battery system.

BACKGROUND ART

When charging or discharging is stopped, a terminal voltage of a storage battery is measured, and by this an open circuit voltage can be detected. However, in an inner equivalent circuit of the storage battery, as an impedance circuit includes a capacitive component, the terminal voltage transiently changes for a while (for example, several minutes to several hours) after charging or discharging is stopped. In order to estimate a stable open circuit voltage without waiting for a convergence of the terminal voltage, in a conventional method, after charging or discharging is stopped, by using the voltage value within a predetermined time length, a plurality of coefficients of which an approximate expression containing plural exponential functions is used are obtained by the least-square method (refer to patent literature 1 described below).

CITATION LIST

Patent Literature

Patent Document 1: PCT Publication No. WO 2006/129802

SUMMARY OF THE INVENTION

By the above conventional method, a stable open circuit voltage (a convergence value of the open circuit voltage) might be obtained. However, fitting for using the plural exponential functions is necessary, and setting of parameters becomes complicated, and then a computing load is heavy.

Then, one non-limiting and explanatory embodiment provides a battery state estimation device and a storage battery system which can accurately estimate the stable open circuit voltage (the convergence value of the terminal voltage) by a simple computation.

A battery state estimation device of the present disclosure comprises a measured value obtaining portion obtaining measured values of the battery voltage as the terminal voltage of a storage battery in order, a timing setting portion in which during electrical current non-passage after charging or discharging of the storage battery is stopped, a reference timing is set, and a first timing at which battery voltage changes by a predetermined first voltage value with respect to the reference timing, and a second timing at which the battery voltage changes by a predetermined second voltage value larger than the predetermined first voltage value are set by using the measured value of the battery voltage, and an open circuit voltage estimation portion which estimates an open circuit voltage of the storage battery at an object timing after the second timing based on a first time difference between the reference and the first timing, and a second time difference between the first and the second timing.

One non-limiting and explanatory embodiment provides a battery state estimation device and a storage battery system in which a stable open circuit voltage (a convergence value of the open circuit voltage) can be accurately estimated by a simple computation.

DESCRIPTION OF EMBODIMENTS

The following is a detailed explanation of examples of embodiments of the present invention. In each referenced drawing, identical components are denoted by the same reference symbols. As a general rule, redundant explanation of the same components has been eliminated. For the sake of simplicity, signs or symbols may be used with reference to information, signal, physical quantities, states or members, and the names of the information, signal, physical quantities, states or members referred to by the signs or symbols may be abbreviated or eliminated altogether.

Figure 1:
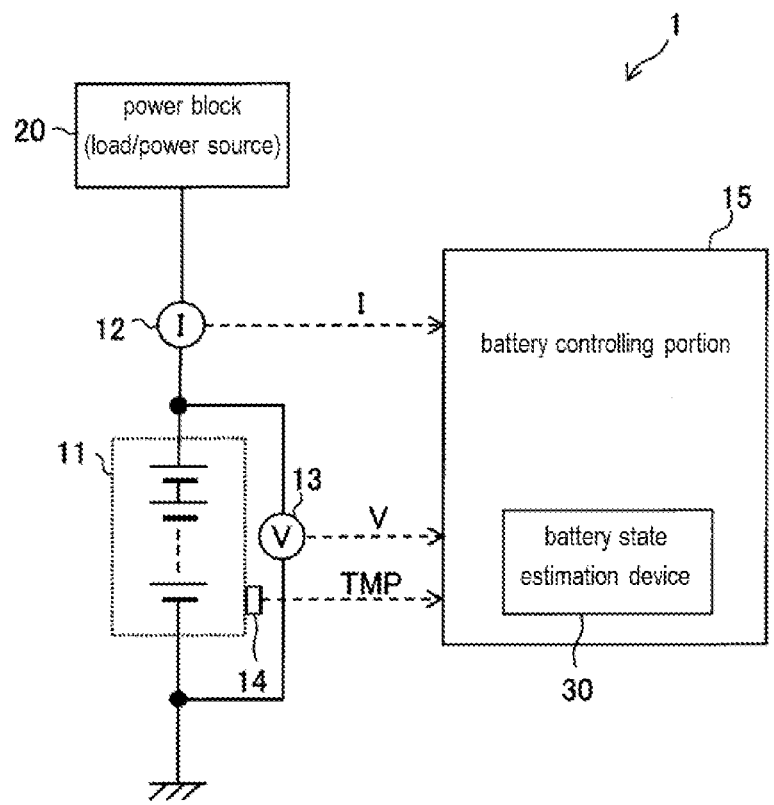
FIG. 1 is a schematic block diagram of a storage battery system related to an embodiment of the present invention.

FIG. 1 is a schematic block diagram of a storage battery system 1 related to an embodiment of the present invention. The storage battery system 1 comprises a battery module 11, a current sensor 12, a voltage sensor 13, a temperature sensor 14, and a battery controlling portion 15. A power block 20 is a configuration element of the storage battery system 1.

Figure 2:
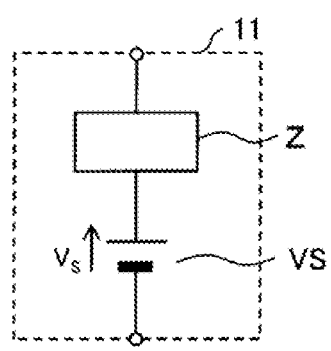
FIG. 2 is an inner equivalent circuit of a battery module related to the embodiment of the present invention.

The battery module 11 has one or more of storage batteries (in other word, secondary batteries). The storage battery composed of the battery module 11 is an arbitrary kind of the storage battery, for example, a lithium ion battery, a nickel hydride battery. In FIG. 1, the battery module 11 is composed of a plurality of the series-connected storage batteries, but the number of the storage batteries composed of the battery module 11 can be one. One part or the whole of the storage batteries contained in the battery module 11 can be connected in parallel each other. In the following, the battery module 11 is considered as the one storage battery. In the embodiment, charging and discharging mean charging and discharging of the battery module 11 unless noted otherwise. FIG. 2 is an inner equivalent circuit of the battery module 11. It is thought that the inner equivalent circuit of the battery module 11 is a series-connected circuit of a voltage source VS which outputs a voltage Vs and has zero of an inner resistance, and an impedance circuit Z which includes a resistance component and a capacitive component.

The power block 20 is connected to the battery module 11. The power block 20 comprises a load and a power source. The battery module 11 supplies discharging power to the load within the power block 20, and receives charging power from the power source within the power block 20. A power conversion circuit (not shown in the figures) can be provided between the battery module 11 and the load and the power source within the power block 20.

The current sensor 12 is provided between the battery module 11 and the power block 20, and measures battery current flowing through the battery module 11 The voltage sensor 13 measures battery voltage V of the terminal voltage of the battery module (namely an electrical potential difference between the positive and negative electrode of the battery module 11). The temperature sensor 14 measures battery temperature TMP of temperature of the battery module 11. The battery temperature TMP is a temperature of, for example, the surface temperature of a pack wrapping the storage battery inside the battery module 11, or a temperature at a specific portion within the battery module 11. Here, symbols of I, V, TMP indicate a value of the batter current, a value of the battery voltage, a value of the battery temperature respectively. Further, the battery current value I, the battery voltage value V, and the battery temperature TMP measured by the sensors 12, 13, and 14 can be called the measured current value I, the measured voltage value V, and the measured temperature TMP, and also can be called the measured value I, V, and TMP for simplification of description.

The battery controlling portion 15 controls charging and discharging of the battery module 11 by using battery state data including the measured value I, V, and TMP. Further, the battery controlling portion 15 has a battery state estimation device 30 which estimates the open circuit voltage or the like of the battery module 11 by using the battery state data.

Figure 3:
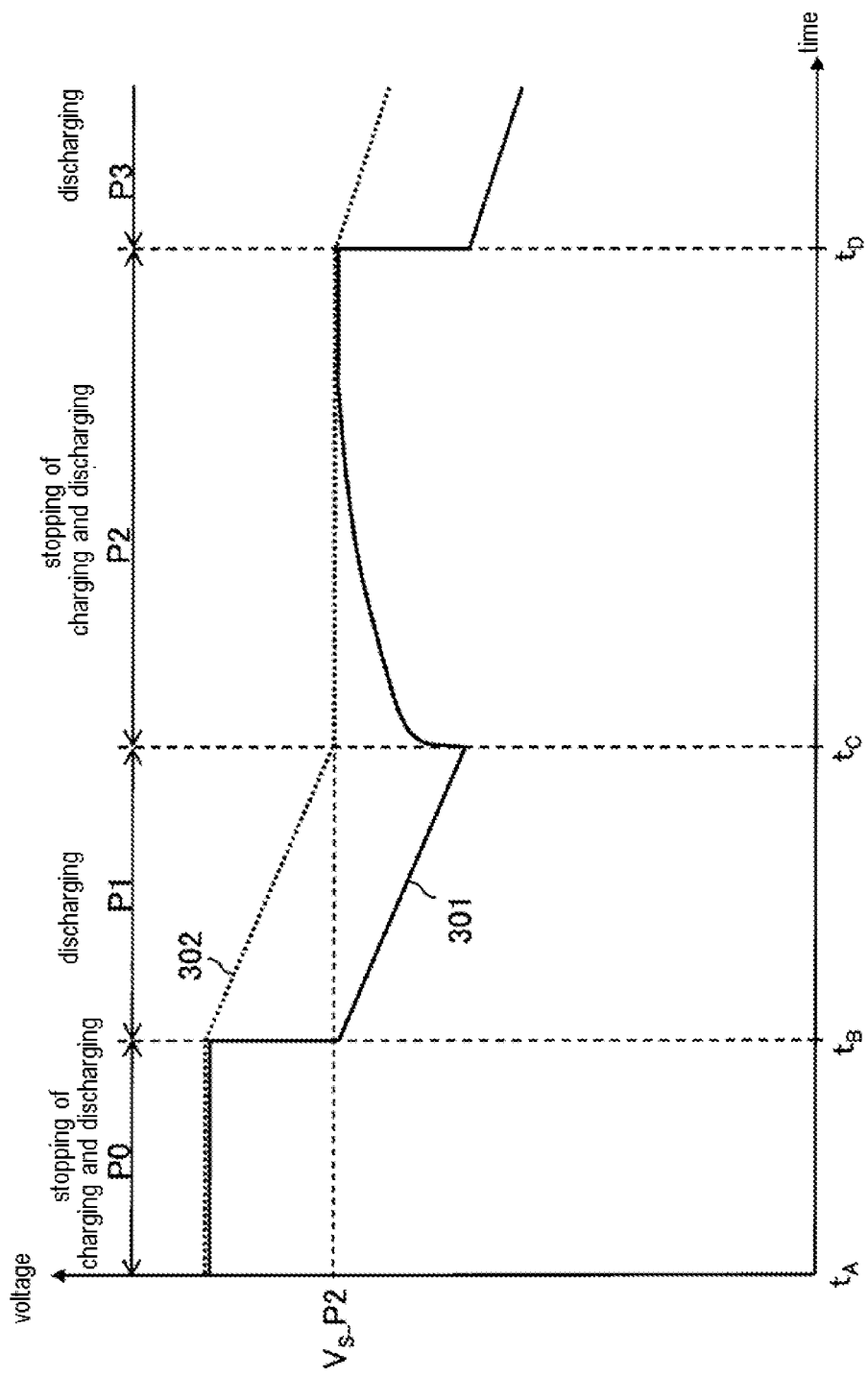
FIG. 3 is a graph showing time transition of a terminal voltage of the battery module and an inner voltage related to the embodiment of the present invention.

In advance of an explanation of the battery state estimation device 30, a state shown in FIG. 3 is assumed in order to concretely explain operation of the battery state estimation device 30. It is assumed that in a period P0 from timing $t_A$ to timing $t_B$, charging and discharging are stopped, and after that, in a period P1 from timing $t_B$ to timing $t_C$, discharging are carried out, and after that, in a period P2 from timing $t_C$ to timing $t_D$, charging and discharging are stopped, in a period P3 after timing $t_D$, discharging are carried out.

Each of the periods P1 and P3 is an electrical current passage period in which discharging or charging of the battery module 11 is carried out. Each of the periods P0 and P2 is an electrical current non-passage period in which discharging or charging of the battery module 11 is stopped. Charging or discharging of the battery module 11 is described also as the electrical current passage of the battery module 11 in the following. In the embodiment, the electrical current passage period P1 is a discharging period for discharging, but the electrical current passage period P1 may be a charging period for charging, and in this case the timing $t_C$ is a timing for stopping charging.

In FIG. 3, a solid line waveform 301 indicates time transition of the battery voltage V, and a dashed line waveform 303 indicates time transition of the voltage Vs (refer to FIG. 2). In the discharge period P1, the battery voltage V is a value left by subtracting a voltage drop by a resistance component of the impedance circuit Z from the voltage Vs. The period changes from the discharging period P1 to the electrical current non-passage P2, and the battery voltage V gradually increases as shown in the waveform 301 for a considerable time (for example, several minutes to several hours), and converges at a constant stable open circuit voltage Vs_P2 of the voltage Vs in the period P2.

Figure 4:
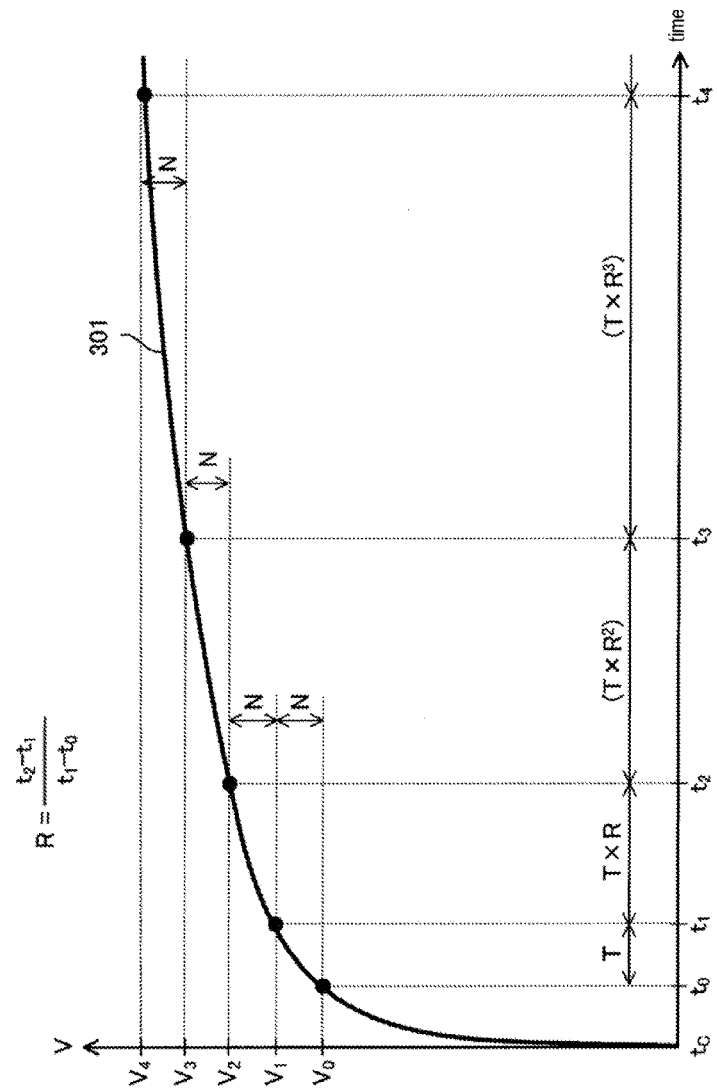
FIG. 4 is a graph showing time variation of battery voltage in an electrical current non-passage period.

FIG. 4 is an enlarged graph of the waveform 301 in the electrical current non-passage period P2. The timings $t_0$ to $t_n$ containing the timings $t_0$ to $t_4$ indicate plural times between the timing $t_c$ and $t_d$ (n: integer). Regarding an arbitrary integer i, the timing $t_{i+1}$ is later than the timing $t_i$. The battery voltage V at the timing $t_i$ is described as the symbol of $V_i$. In addition, regarding an arbitrary integer i, an equation "$V_{i+1}-V_i=N$" is established. N is a plus unit amount (a unit voltage amount), for example, several 10 mV. The timing $t_0$ is a reference timing.

As shown in formulas (A1) and (A2), time length T and voltage change parameter (Hereinafter also simply referred to as parameter.) R are defined. Here, "$t_{i+1}-t_i$" means a time length between the timing $t_{i+1}$ and the timing $t_i$.

$$T=t_1-t_0 \tag{A1}$$

$$R=(t_2-t_1)/(t_1-t_0) \tag{A2}$$

As shown in the formula (A2), the voltage change parameter R is expressed as a ratio of a second time length "$t_2-t_1$" to a first time length "$t_1-t_0$". The first time length "$t_1-t_0$" is a time length required for the battery voltage changing by the unit amount N from the reference timing $t_0$. The second time length "$t_2-t_1$" is a time length required for the battery voltage changing by the unit amount N from the starting timing $t_1$, and then the starting timing $t_1$ is the timing when the battery voltage changes by the unit amount N from the reference timing $t_0$. Here, in the embodiment, the electrical current passage period 1 before the electrical current passage period 2 is a discharging period, the change of the battery voltage V in the electrical current non-passage period P2 is "increase". When the electrical current passage period P1 is a charging period, the change of the battery voltage V in the electrical current non-passage period P2 is "decrease".

From the formulas (A1) and (A2), an equation "$t_2-t_1=T \times R$" is established (refer to also FIG. 4). In the electrical current non-passage period P2, the battery voltage V changes toward the stable open circuit voltage Vs_P2 (refer to FIG. 3), and since the impedance circuit Z contains the capacitive component, its changing speed gradually decreases as time passes. As it is clear from the definition of the timing $t_1$ and the equation (A2), the voltage change parameter R has a value corresponding to a change rate (a decrease rate) of a change speed of the battery voltage V in the electrical current non-passage period P2.

In the battery state estimation device 30, an assumption (in other words, a proposition) "a time length required for the battery voltage changing by the unit amount N becomes R times of the previous time every time the battery voltage changes (here, increases) by the unit amount N in the electrical current non-passage period P2." is considered. The assumption ASM also means "the change rate of a change speed of the battery voltage V in the electrical current non-passage period P2 is unchanged". When the assumption ASM (the proposition) is true, the equations "$t_3-t_2=T \times R^2$", "$t_4-t_3=T \times R^3$", . . . , "$t_n-t_{n-1}=T \times R^{n-1}$" are established, and then also the following equation (A3) is established. And from the equation (A3), an equation (A4) is obtained.

[Equation 1]

$$t - t_0 = \sum_{k=0}^{\Delta V/N - 1} T \times R^k \qquad (A3)$$

$$= \frac{T(1 - R^{\Delta V/N})}{1 - R}$$

$$V_{EST}(t) = V_0 + N(\log_R(1 - (t - t_0)(1 - R)/T)) \qquad (A4)$$

Here, "t" indicates an arbitrary timing in the electrical current non-passage period P2.

"$t-t_0$" indicates a time length from the reference timing $t_0$ to the timing t.

"$\Delta V$" indicates a change amount of the battery voltage between the timing $t_0$ and t.

"$V_{EST}(t)$" indicates the battery voltage V which can be estimated by the battery state estimation device 30 at the timing t. Then, when the equation (A4) is obtain from the equation (A3), a relational equation "$\Delta V = V_{EST}(t) - V_0$" is used.

In the battery state estimation device 30, change of the battery voltage V after the timing $t_2$ is expressed by the equation (A4), and the battery voltage V as "$V_{EST}(t)$" at the timing t is estimated (forecasted) by the estimation equation (A4) at the time before the timing t.

Here, the timing t in future after the present timing (for example, $t_2$) also hereinafter refers to as an object timing, and "VEST(t)" also hereinafter refers to as an estimated open circuit voltage (forecasted open circuit voltage).

The concrete examples of the storage battery system 1 (especially, the battery state estimation device 30) based on the above configuration are explained in the following. As long as there is a contradiction, arbitrary two or more examples in the plural examples can be combined.

First Example

Figure 5:
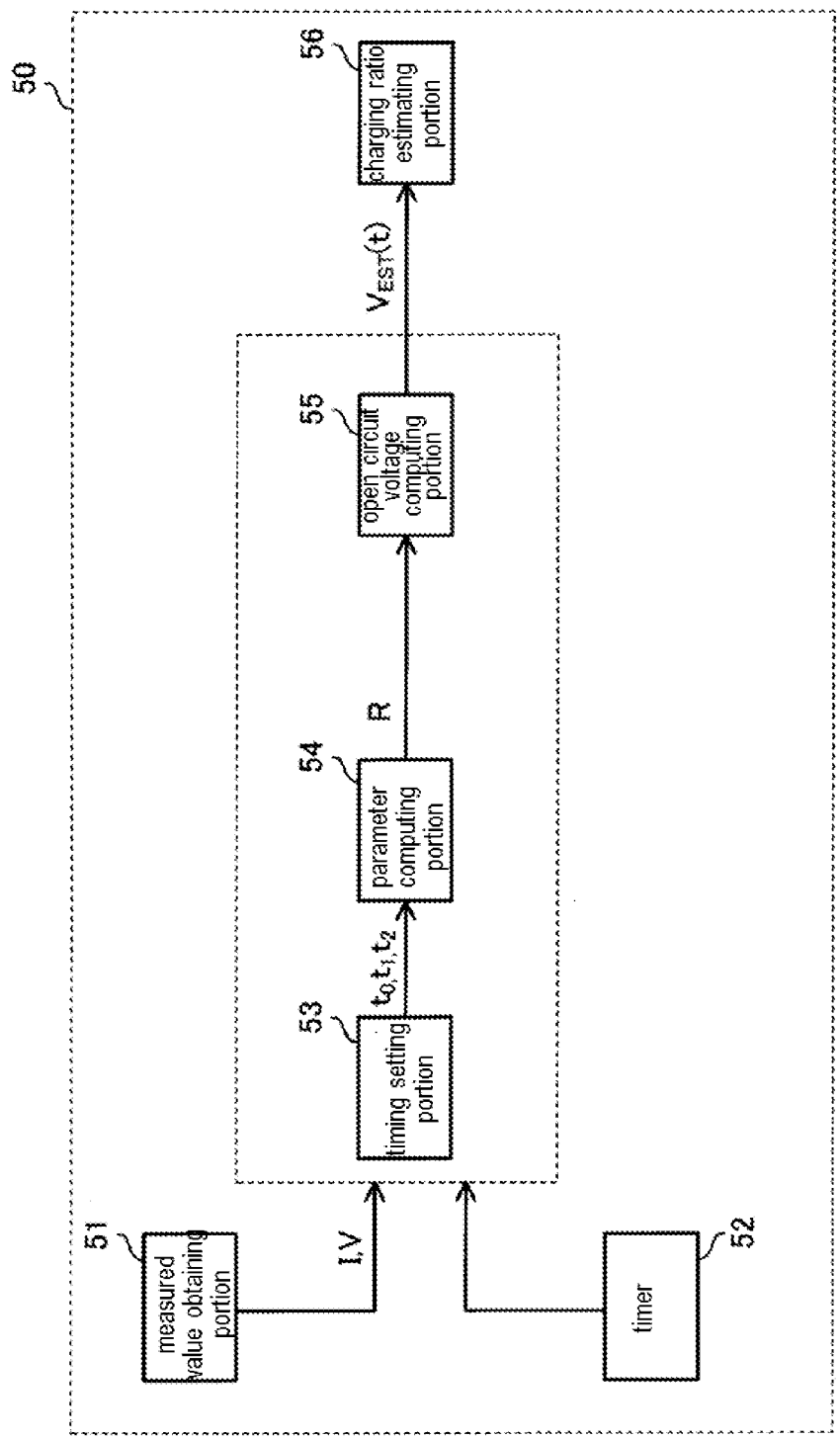
FIG. 5 is an inner block diagram of an estimation device of open circuit voltage/charging ratio related to the first example of the present invention.

A first example is explained in the following. FIG. 5 is an inner block diagram of an estimation device 50 of open circuit voltage/charging ratio which is contained in the battery state estimation device 30. The estimation device 50 related to the first example comprises members expressed by reference marks 51 to 56.

A measured value obtaining portion 51 periodically obtains the measured current value I, the measured voltage value V, and the measured temperature TMP by sampling output signals from the sensors 12, 13, and 14 in a predetermined sampling period. However, the measured temperature TMP may not be obtained. A timer 52 measures and obtains present time, or measures elapsed time from an arbitrary time. Each of the members inside the battery state estimation device 30 including the estimation device 50 can obtain and use obtained result of the obtaining portion 51, obtaining/measured result of the timer 52.

The timing setting portion 53 sets a reference timing, a first timing, and a second timing by using the measured voltage value V during the electric current non-passage after charging or discharging of the battery module 11 is stopped. The duration of the electric current non-passage includes a voltage change term in which the battery voltage V transiently changes, and during the voltage change term, the reference timing, the first timing, and the second timing are set. Also in the first example, the duration of the electric current non-passage in which the open circuit voltage is estimated is the period P2, and the timing $t_0$ is set as the reference timing (other examples described below are in the same say).

The timing setting portion 53 sets the reference timing $t_0$, for example, based on the elapsed time after the electric current passage of the battery module 11 is stopped. More concretely, the timing setting portion 53 sets the timing when a predetermined time elapses from a boundary timing $t_c$ (the timing of stopping discharging) between the period P1 and the period P2 as the reference timing $t_0$.

Otherwise, for example, the timing setting portion 53 may set the reference timing $t_0$ based on the voltage change amount of the battery voltage V after the electric current passage of the battery module 11 is stopped. More concretely, the timing setting portion 53 sets the timing when a predetermined voltage amount increases from the voltage value $V[t_c]$ of the measured voltage value V at a boundary timing $t_c$ (the timing of stopping discharging) between the period P1 and the period P2 as the reference timing $t_0$. Further, the timing setting portion 53 monitors the change amount of the battery voltage V per unit time as a monitoring object amount, and sets the timing when the monitoring object amount decreases into a predetermined value or less as the reference timing $t_0$.

The timing setting portion 53 sets a first timing at which battery voltage V changes by a predetermined first voltage value (amount) with respect to the reference timing $t_0$, and a second timing at which the battery voltage changes by a predetermined second voltage value (amount) larger than the predetermined first voltage value with respect to the reference timing $t_0$, using the measured value V obtained in order In the first example, the first voltage value is equal to the above unit amount N, and the second voltage value is two times more than the unit amount N (refer to FIG. 4). According to this, the first and second timings are the timings $t_1$ and $t_2$ respectively.

The parameter computing portion 54 computes a voltage change parameter R according to the above equation (A2) based on a first time difference $(t_1-t_0)$ between the reference and the first timing, and a second time difference $(t_2-t_1)$ between the first and the second timing. Then, those timings are set by the timing setting portion 53

The open circuit voltage computing portion 55 estimates the open circuit voltage $V_{EST}(t)$ according to the estimation equation (A4) in a timing after the timing $t_2$ and before the object timing t, by using the voltage change parameter R computed by the computing portion 54. The timing setting portion 53 holds the measured voltage value at the reference timing $t_0$ as the reference voltage value $V_0$, and the computing portion 55 substitutes the held reference voltage value $V_0$ for the equation (A4). The value "T" in the equation (A4) is provided from the timing setting portion 53 to the computing portion 55. Further, the computing portion 55 computes the elapsed time $(t-t_0)$ from the reference timing $t_0$) to an objecting timing t (estimating timing) by using the timer 52.

The object timing t is an arbitrary timing after the timing $t_2$. The object timing t may be a timing when a predetermined time length elapses (for example, 1 hour or several hours) after the timing $t_C$, $t_0$, or $t_2$. Depending on the property of the battery module 11, the battery voltage V approximately reaches at the stable open circuit voltage Vs_P2 about one hour after the current passage is stopped, and when the object timing t is set at the timing of one hour after the timing $t_C$, the realistic $V_{EST}(t)$ is obtained, and then $V_{EST}(t)$ can be regarded as the estimation value of the stable open circuit voltage Vs_P2.

As understood from the above explanation (as understood from the equation (A3) as the base of the equation (A4)), the open circuit voltage $V_{EST}(t)$ is estimated from the equation (A4). It means that the above assumption ASM is regarded as the truth (the proposition ASM is regard as the truth) and the open circuit voltage of the battery module 11 is estimated.

A charging ratio estimating portion 56 estimates the charging ratio of the battery module 11 from the estimated open circuit voltage $V_{EST}(t)$ by using a predetermined calculating equation or a table data. The charging ratio of the battery module 11 is a ratio of a remaining capacity of the battery module 11 to the full charge capacity of the battery module, and it is generally called as SOC (State of Charge).

Figure 6:
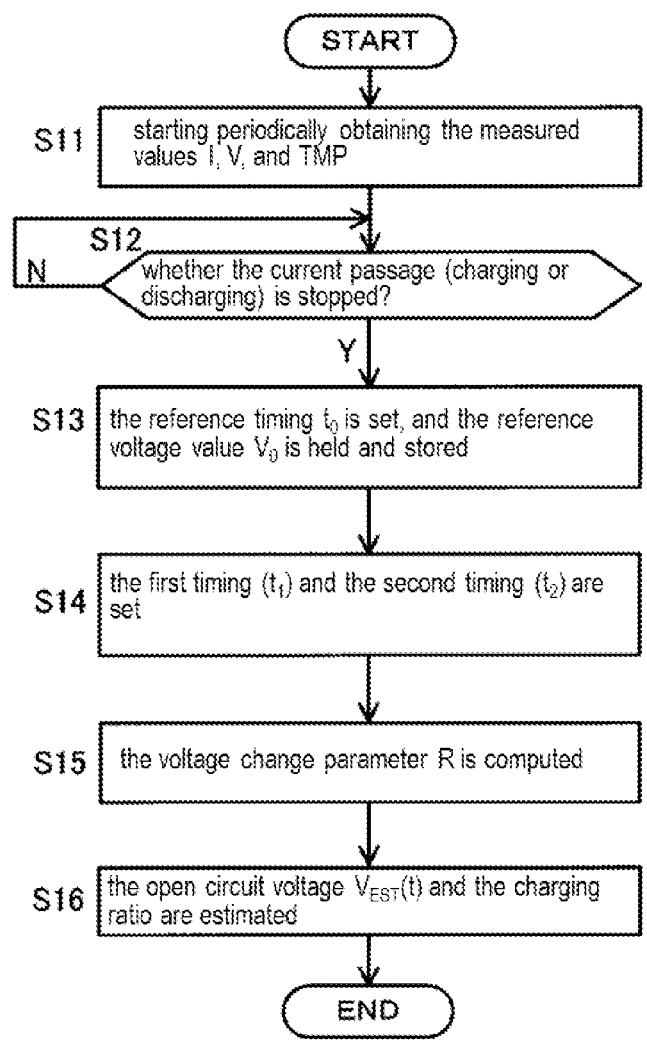
FIG. 6 is a flow chart related to estimation process related to the first example of the present invention.

A flow chart related to estimation process of the open circuit voltage is shown in FIG. 6. In step S11, the measured value obtaining portion 51 starts periodically obtaining the measured values I, V, and TMP (for example, obtaining in order in the period of 10 m seconds). However, the measured values TMP may not be obtained. After that, the timing setting portion 53 determines as to whether or not the current passage (charging or discharging) of the battery module 11 so far is stopped, by monitoring the measured value I. Then, when stopping of the current passage is confirmed, according to the above mentioned way, the reference timing $t_0$ is set, and the measured voltage value at the reference timing $t_0$ as the reference voltage value $V_0$ is held and stored (step S12 and S13). Further, after that, the timing setting portion 53 selects and sets the timing as the first timing ($t_1$) when the measured value V changes by the first voltage amount (for example, N) from the reference voltage value ($V_0$), and the timing as the second timing ($t_2$) when the measured value V changes by the second voltage amount (for example, 2×N) from the reference voltage value ($V_0$), by comparing the measured value V obtained in order with the reference voltage value ($V_0$) (step S14). The voltage change parameter R is computed and obtained from the set reference, first, and second timings (step S15), and the open circuit voltage $V_{EST}(t)$ and the charging ratio are estimated by using this voltage change parameter R (step S16).

According to this way or configuration, as only by monitoring the change of the battery voltage, the parameter R which is necessary for the estimation of the open circuit voltage is computed and obtained, and then it is possible that the stable open circuit voltage Vs_P2 (the convergence value of the open circuit voltage) can be accurately estimated by a simple computation.

Figure 7:
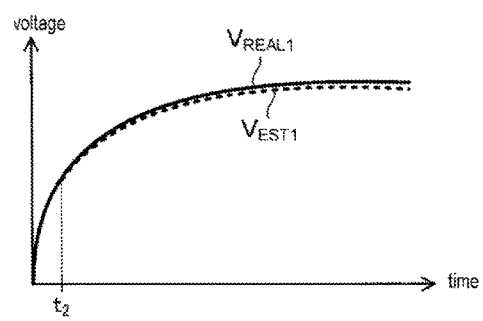
FIG. 7 is a graph showing experimental waveforms of the measured voltage and the estimated open circuit voltage in the current non-passage period.

In FIG. 7, a solid waveform $V_{REAL1}$ and a dashed waveform $V_{EST1}$ indicate experimental waveforms of the measured voltage V and the estimated open circuit voltage $V_{EST}(t)$ in the current non-passage period P2 under a certain condition. Then, both waveforms coincide with each other, and it is understood that the precise estimation is made.

Second Example

Figure 8:
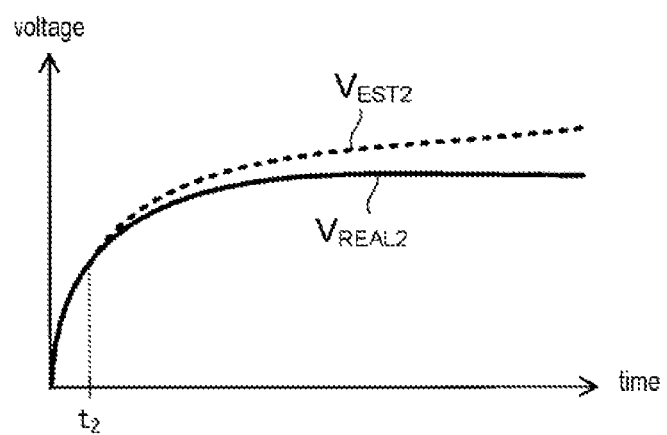
FIG. 8 is a graph showing experimental waveforms of the measured voltage and the estimated open circuit voltage in the current non-passage period.

However, the waveforms of $V_{REAL1}$ and $V_{EST1}$ of FIG. 7 are obtained in a certain temperature condition (for example, under the condition at the battery TMP 25° C.). However, as shown in FIG. 8, error between the estimate open circuit voltage $V_{EST}(t)$ and realistically measured voltage V becomes big in a certain battery temperature TMP. In FIG. 8, a solid waveform $V_{REAL2}$ and a dashed waveform $V_{EST2}$ indicate experimental waveforms of the measured voltage V and the estimated open circuit voltage $V_{EST}(t)$ in the current non-passage period P2 under the condition at a low temperature (for example, under the condition at the battery temperature TMP 0° C.). Here, the waveform $V_{EST2}$ is the estimated open circuit voltage $V_{EST}(t)$ without a parameter compensating described below. In the second example, configuration to reduce the error of the estimated open circuit voltage is explained. Further, as the change of the battery voltage V after charging or discharging is stopped is influenced also by factors other than the battery temperature TMP, it is preferable that the factors which influence such change are considered.

Figure 9:
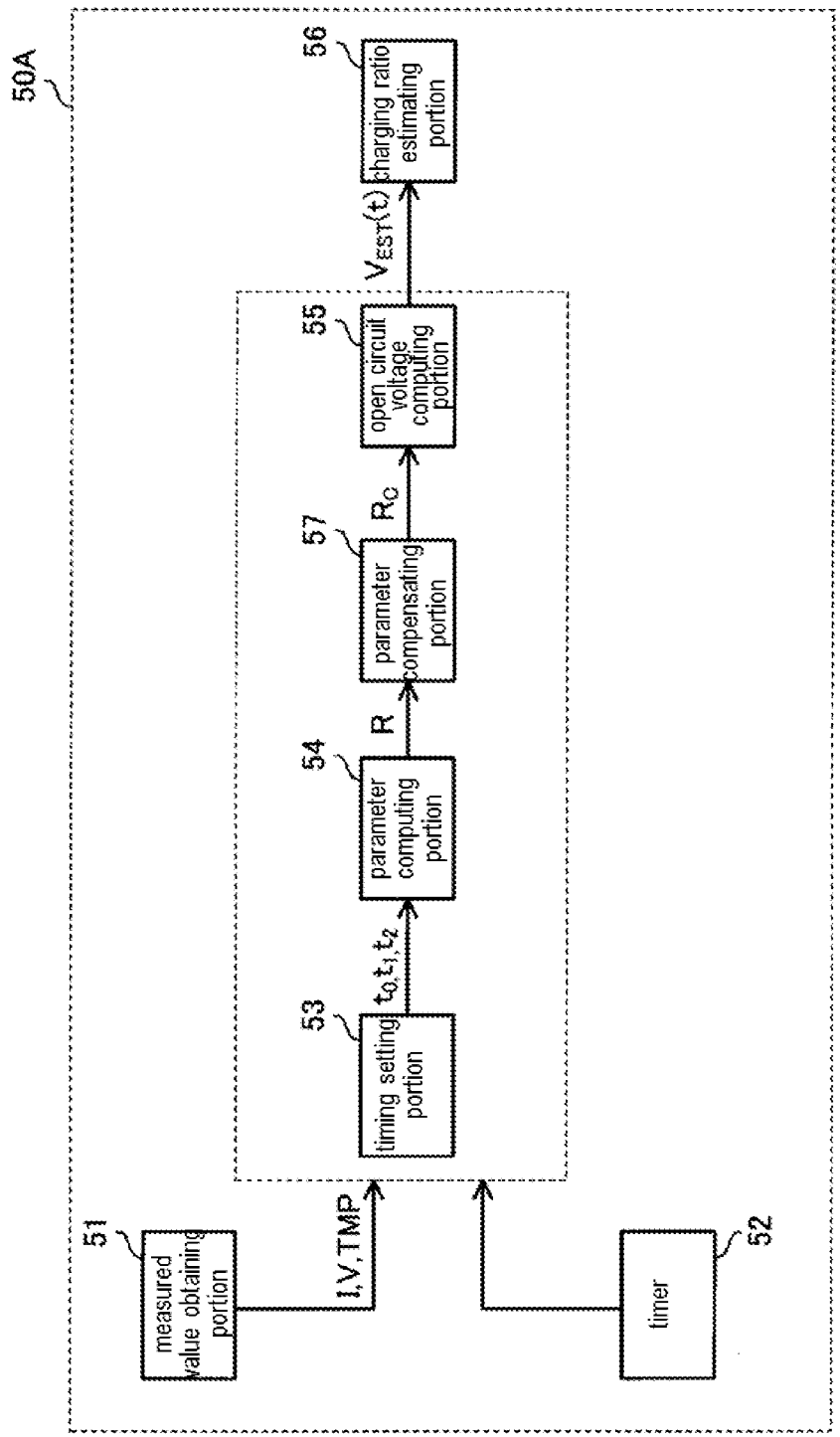
FIG. 9 is an inner block diagram of an estimation device of open circuit voltage/charging ratio related to the second example of the present invention.

FIG. 9 is an inner block diagram of an estimation device 50A of open circuit voltage/charging ratio related to the second example. The estimation device 50A is provided in the battery state estimation device 30 of FIG. 1. A parameter compensating portion 57 is added to the estimation device 50 of FIG. 5, and then the estimation device 50A of FIG. 9 is formed. Except for the parameter compensating portion 57, the configuration or operation of the estimation device 50A are the same as the estimation device 50 described in the first example.

The parameter compensating portion 57 compensates the parameter computed by the parameter computing portion 54 by an index for compensation. The voltage change parameter R after the compensation is described as a symbol of "$R_C$". When the parameter R is compensated as a parameter $R_C$, the open circuit voltage computing portion 55 estimates the open circuit voltage $V_{EST}(t)$ at the object timing t by using the parameter $R_C$ as the parameter R in the equation (A4) and according to the equation (A4).

The index for compensation includes one or more of the following first to fourth indexes. The compensating portion 57 may compensate the voltage change parameter R by using two, three, or four among the first to fourth indexes.

The first index is the battery temperature TMP. The battery temperature as the first index is the measured temperature TMP as a reference timing at the time of stopping the current passage of the battery module 11. Namely, for example, the battery temperature as the first index is the measured temperature TMP at the timing $t_C$, the timing at a predetermined time before the timing $t_C$, or the timing at a predetermined time after the timing $t_C$.

The second index is a current rate (current amount per unit time) of the current passage of the battery module 11 in the current passage period P1.

The third index is a charging ratio change value ΔSOC [P1] in the current passage period P1. The estimation device 50A in FIG. 9, or the battery state estimation device 30 in FIG. 1 integrates the measured current value I, and the charging ratio changing value ΔSOC [P1] as the third index can be obtained from its integrated value and the full charge capacity of the battery module 11.

The fourth index is the charging ratio SOC [P2] of the battery module 11 in the current non-passage period P2. The charging ratio SOC [P2] of the battery module 11 in the current non-passage period P2 is equal to the charging ratio at the end of the current passage period P1 (namely, the timing $t_C$). The estimation device 50A of FIG. 9, or the battery state estimation device 30 of FIG. 1 can obtain the charging ratio SOC [P0] of the battery module 11 in the current non-passage period P0 by using the way mentioned in the first example (namely, it can be obtained from the estimated open circuit voltage in the current non-passage period P0), or from the really measured open circuit voltage (measured voltage V) in the current non-passage period P0. The charging ratio SOC [P2] can be obtained by using the charging ratio SOC [P0] and the above charging ratio changing value ΔSOC [P1].

The change of the battery voltage during the current non-passage period is realistically investigated with the first and fourth indexes being changed, and by using the result of its investigation, a calculating equation or a table data which converts the parameter R into a parameter $R_C$, is made corresponding to the indexes for the compensation, and then the obtained calculating equation or table data may be held or stored in the parameter compensating portion 57

Figure 10:
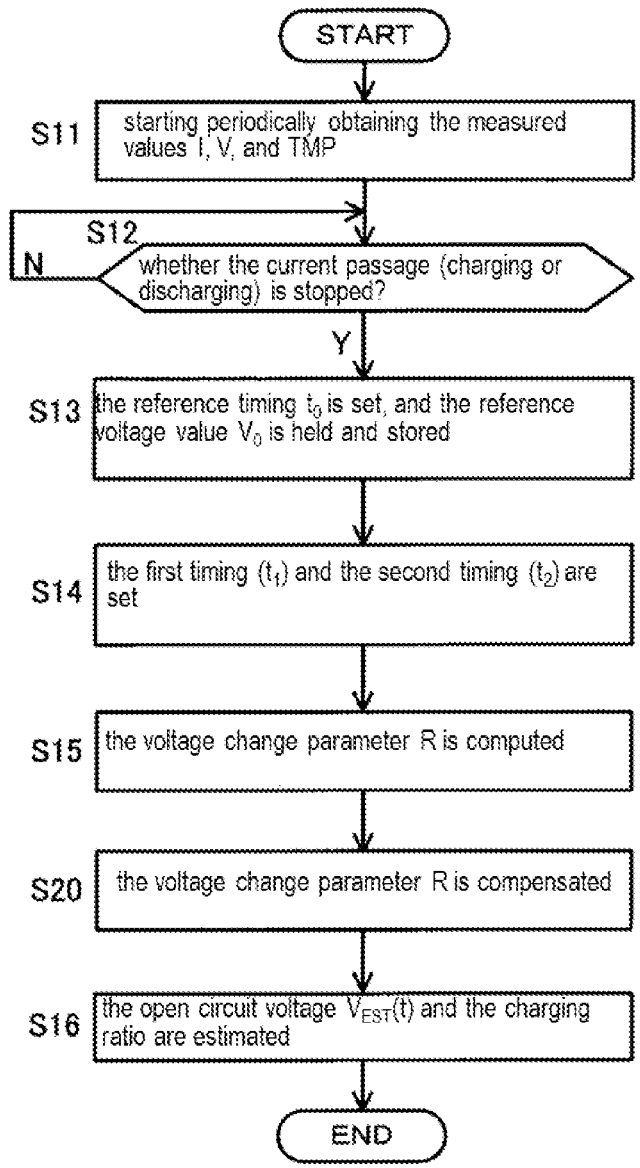
FIG. 10 is a flow chart related to estimation process related to the second example of the present invention.

FIG. 10 is a flow chart related to estimation process of the open circuit voltage related to the second example. Except for inserting a parameter compensation step S20 between the parameter R computing step S15 and the open circuit estimation step S16, the flow chart of FIG. 10 is the same as that of FIG. 6. The computed parameter R is compensated to the parameter $R_C$ (Step S20), and by using the parameter $R_C$, the open circuit voltage $V_{EST}(t)$ and the charging ratio are estimated (Step S16).

In the second example, as the voltage change parameter R is compensated considering the indexes of the compensation influencing the change of the battery voltage after charging or discharging is stopped, the accuracy in the estimation of the open circuit voltage can be improved.

Third Example

Figure 11:
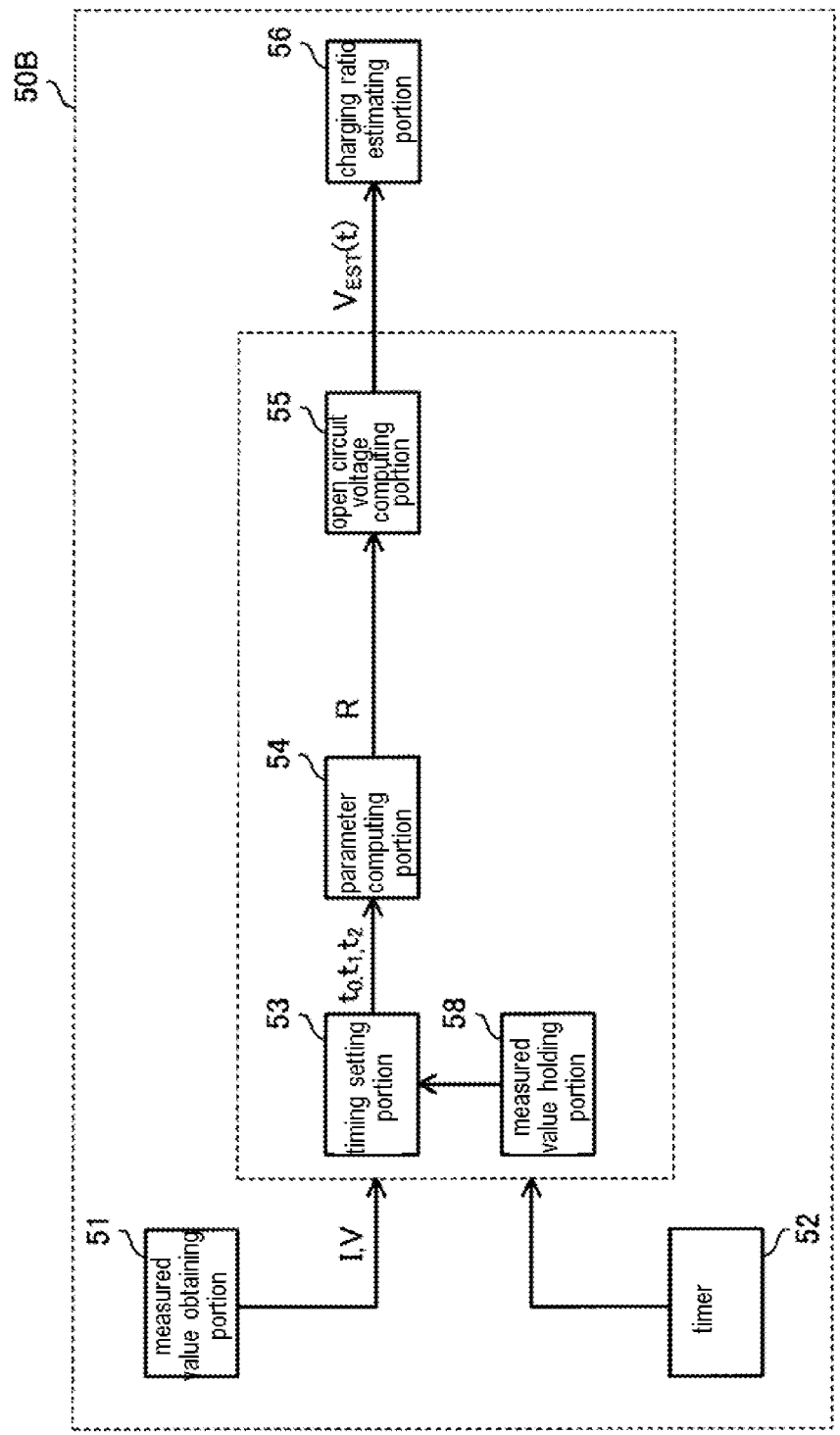
FIG. 11 is an inner block diagram of an estimation device of open circuit voltage/charging ratio related to the third example of the present invention.

A third example is explained. FIG. 11 is an inner block diagram of an estimation device of open circuit voltage/charging ratio related to the third example. The estimation device 50B is provided in the battery state estimation device 30 of FIG. 1. A measured value holding portion 58 is added to the estimation device 50 of FIG. 5, and then the estimation device 50B of FIG. 11 is formed. Except for the existence of the measured value holding portion 58 or the content described below corresponding to its existence, the configuration or operation of the estimation device 50B are the same as the estimation device 50 described in the first example.

The measured value holding portion 58 holds or stores the measured values obtained in order in the measured value obtaining portion 51 for a predetermined time $t_Q$ after the end of the current passage period P1. Namely, the measured value holding portion 58 holds or stores the measured voltage values V obtained during in a state corresponding to each of measured times (namely, to hold time-series data of the measured voltage values during the holding object term 320). The holding object term 320 is the term from the timing $t_C$ to the timing $t_{CQ}$ after a predetermined time $T_Q$ elapses from the timing $t_C$. The measured value holding portion 58 may hold or store the measured voltage values V for more than the predetermined time $T_Q$.

Figure 12:
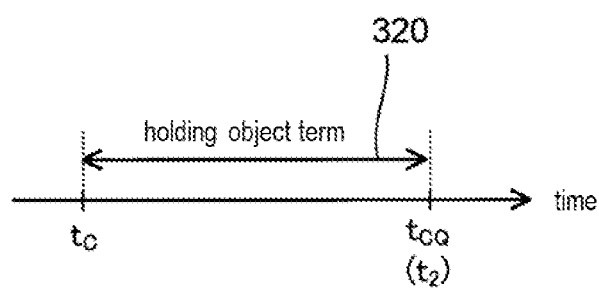
FIG. 12 is a figure showing a holding object term related to the third example of the present invention.

In the third example, the timing setting portion 53 does not set the reference timing $t_0$, the first timing $t_1$, and the second timing $t_2$ from the reference timing $t_0$, but the timing setting portion 53 treats the end timing $t_{CQ}$ of the holding object term 320 as the second timing $t_2$ (refer to FIG. 12), and after that, based on the measured voltage value V held or stored in the measured value holding portion 58, sets the reference timing $t_0$ and the first timing $t_1$ from the second timing $t_2$ as the reference.

More concretely, for example, the timing setting portion 53 sets the timing $t_{CQ}$ as the second timing $t_2$, and treats the measured voltage value V as the voltage value $V_2$ at the second timing $t_2$ of the timing $t_{CQ}$ (refer to FIG. 4). After that, for example, the timing setting portion 53 selects the measured voltage value V (namely, $V_1$) which is by the unit amount N lower than the voltage value $V_2$, the measured voltage value V (namely, $V_0$) which is by two times the unit amount N lower than the voltage value $V_2$, among the holding contents of the holding portion 58. Then, the timing setting portion 53 sets and fixes the timing as the first timing $t_1$ corresponding to the former measured voltage value V (namely, $V_1$), and the timing as the reference timing $t_0$ corresponding to the latter measured voltage value V (namely, $V_0$).

The process after setting the timing $t_0$, $t_1$, $t_2$ is the same as mentioned in the first example. The parameter compensating portion 57 of FIG. 9 is added to the estimation device 50B of FIG. 11, and then the estimation of the open circuit voltage $V_{EST}(t)$ based on the compensation of the parameter R and the parameter R after the compensation (namely, $R_c$) may be carried out as mentioned in the second example.

In the above first example, after setting the reference voltage $V_0$, the timing $t_2$ is not fixed until the measured voltage V corresponding to the voltage value $V_2$ (=$V_0$+2N) is really measured, and then the open circuit voltage cannot be estimated. On the other hand, in the way of the third example, after the current passage is stopped, the open circuit voltage can be estimated at the timing $t_2$ when the predetermined time $T_Q$ elapses. It is required that the estimation of the open circuit voltage is carried out within a certain predetermined time in some system (surely to know the open circuit voltage within a certain predetermined time). The third example meets such a requirement.

Fourth Example

Figure 13:
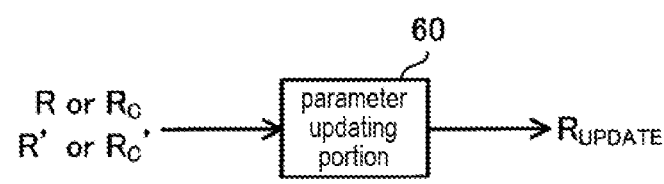
FIG. 13 is a figure showing a parameter updating portion related to the fourth example of the present invention.

A fourth example is explained in the following. In the fourth example, a parameter updating method which can be combined with the first to third examples is explained. It is possible that a parameter updating portion 60 (refer to FIG. 13) related to the fourth example is added to the estimation device 50, 50A, or 50B (FIG. 5, FIG. 9 or FIG. 11). In the following, the process of the estimation device 50, 50A, or 50B to which the updating portion 60 is added, is explained in the fourth example.

The timing setting portion 53 related to the fourth example sets the timing $t_0$, $t_1$, and $t_2$, and further sets the reference timing $t_0'$, and selects and sets the timing as the first timing $t_1'$ when the measured value V changes by the first voltage amount (for example, N) from the reference timing $t_0'$, and the timing as the second timing $t_2'$ when the measured value V changes by the second voltage amount (for example, 2×N) from the reference timing $t_0'$, by using the measured value V. The reference timing $t_0'$ is an arbitrary timing after the timing $t_0$, and may be the same timing as the timing $t_1$, or $t_2$, and may be a predetermined timing after the timing $t_2$.

Figure 14:
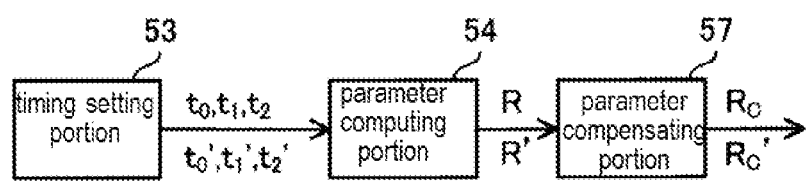
FIG. 14 is a figure showing data flow related to process of the fourth example of the present invention.

The timing $t_0'$, $t_1'$, and $t_2'$ function as the updating timing, and the updating timing $t_0'$, $t_1'$, and $t_2'$ are set, and then the parameter computing portion 54 computes the updating parameter R' according to the following equation (B1) (refer to FIG. 14). "$t_{i+1}'-t_i'$" indicates the time length (=difference) between timing $t_{i+1}'$ and $t_i'$.

$$R'=(t_2'-t_1')/(t_1'-t_0') \qquad (B1)$$

When there is the parameter compensating portion 57, in the same way as the parameter R is compensated to the parameter $R_C$, based on the index for compensation, the updating parameter R' is compensated to the updating parameter $R_C$' (refer to FIG. 14).

When the updating parameter R' and $R_C$' are obtained, the parameter updating portion 60 obtains the parameter $R_{UPDATE}$, according to the following equations (B2) or (B3). A weighting factor w in the equations (B2) and (B3) may be 1, or may be an arbitrary predetermined value in the range of "0<w<1".

$$R_{UPDATE} = (1-w) \cdot R + w \cdot R' \quad (B2)$$

$$R_{UPDATE} = (1-w) \cdot R_C + w \cdot R_{C'} \quad (B3)$$

The open circuit voltage computing portion 55 estimates the open circuit voltage $V_{EST}(t)$ based on the parameter R or $R_C$ before obtaining the parameter $R_{UPDATE}$. However, after obtaining the parameter $R_{UPDATE}$, the open circuit voltage computing portion 55 estimates the open circuit voltage $V_{EST}(t)$ based on the parameter $R_{UPDATE}$. Namely, after obtaining the parameter $R_{UPDATE}$, the computing portion 55 substitutes the parameter $R_{UPDATE}$ for "R" of the equation (A4), and estimates the open circuit voltage $V_{EST}(t)$ at the object timing t according to the above equation (A4). Thus, by obtaining the parameter $R_{UPDATE}$, the voltage change parameter R used to estimate the open circuit voltage, is updated (the parameter $R_{UPDATE}$ is corresponding to the parameter R after updating).

After the current passage is stopped, the battery voltage V gradually converges at a constant stable open circuit voltage Vs_P2, being influenced by various factors. The change of the battery voltage V at the middle or last stage of the voltage changing time shows the convergence toward the constant stable open circuit voltage Vs_P2 more precisely than the change of the battery voltage V at the initial stage of the voltage changing time. Therefore, by updating the voltage change parameter R like the fourth example, the accuracy of the estimation of the open circuit voltage can be improved. The process in which the voltage change parameter is updated once, is explained, but according to the above same method, the timings $t_0'$, $t_1'$, and $t_2'$ are set plural times, and the updating processes are carried out plural times.

Fifth Example

Figure 15:
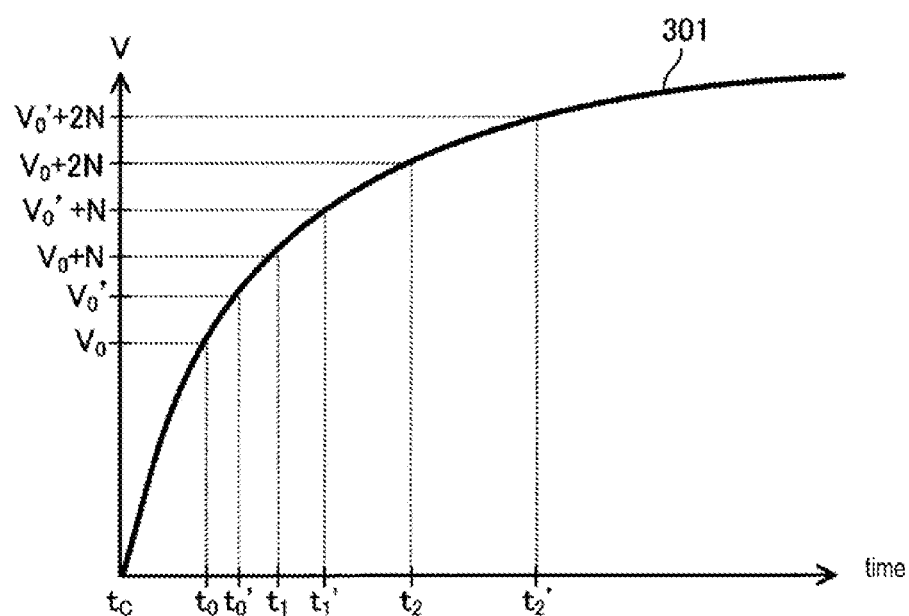
FIG. 15 is a figure showing relation of expected plural timings in the fifth example of the present invention.

A fifth example which combines the first to fourth examples, is explained. The timings $t_0'$, $t_1'$, and $t_2'$ as mentioned above are not used to update the voltage change parameter R, but setting of the parameter may be used. FIG. 15 is the concrete instance of the timings $t_0$, $t_1$, and $t_2$, or the timings $t_0'$, $t_1'$, and $t_2'$, expected in the fifth example. In the instance of FIG. 15, the battery voltages V at the timings $t_0$, $t_1$, and $t_2$, are $V_0$, $(V_0'+N)$, and $(V_0'+2N)$, respectively.

The parameter computing portion 54 computes the voltage change parameter R and R' based on the above (A2) and (B1), and after that, a voltage change parameter $R_J$ is obtained according to the equation (B4). A weighting factor w in the equations (B4) may be an arbitrary predetermined value in the range of "0<w<1", and typically may be 0.5. When there is the parameter compensating portion 57, in the same way as compensating the parameter R to the parameter $R_C$, the parameter $R_J$ may be compensated to the parameter $R_{JC}$. The open circuit voltage computing portion 55 substitutes the parameter $R_J$ and $R_{JC}$ for "R" of the equation (A4), and the open circuit voltage $V_{EST}(t)$ at the object timing t is estimated according to the above equation (A4).

$$R_J = (1-w) \cdot R + w \cdot R' \quad (B4)$$

Sixth Example

A sixth example which combines the first to fourth examples, is explained. The above fifth example is one type in which the voltage change parameter is set by the timings of 4 points or more. As described in the following, the voltage change parameter may be set by the timings of 4 points or more. The timing setting portion 53 sets the timing $t_0$, $t_1$, and $t_2$, and then the third timing at which the battery voltage V changes by a predetermined third voltage amount from the reference timing $t_0$ is set from the measured value V obtained in order. The third voltage amount is larger than the first or second voltage value. Here, the first or second voltage amount is one time or two times more than the unit amount N, respectively. Then, when the third voltage amount is 3 times more than the unit amount N, the third timing is the timing $t_3$ of FIG. 4.

The parameter computing portion 54 related to the sixth example, obtains the value of the parameter R which accurately satisfies the following equations (C1) to (C3) by the least-square method or the like. The process after obtaining the parameter R is the same as described in the above examples.

$$t_1 - t_0 = T \quad (C1)$$

$$t_2 - t_1 = T \times R \quad (C2)$$

$$t_3 - t_2 = T \times R^2 \quad (C3)$$

Here, the parameter R is decided by the four timings $t_0$ to $t_3$. However, the parameter R may be decided by the timings of five or more (for example, the timings $t_0$ to $t_4$). By increasing the number of the timings for computing, the parameter become appropriate, and the accuracy of the estimation of the open circuit voltage can be improved.

Seventh Example

In a seventh example, the technologies which are applicable to some one of the first to sixth examples, is explained.

In the above explanation, it is mainly assumed that the change amount of the battery voltage V from the reference timing $t_0$ to the i timing $t_i$ is i times more than the unit amount N (in the other words, the change amount of the battery voltage V between the timing $t_i$ and the timing $t_{i+1}$ is always the unit amount N). However, the change amount of the battery voltage V between the timing $t_i$ and the timing $t_{i+1}$ can be expressed by a logarithmic function or an exponential function depending on an integer i. For example, when the change amount of the battery voltage V between the timing $t_0$ and the timing $t_1$ is the unit amount N, the change amount of the battery voltage V between the timing $t_1$ and the timing $t_2$ may be expressed by "log N" or "$N^m$" (m: a predetermined value). Also in this case, the parameter computing portion 54 and the open circuit voltage computing portion 55 regard the above assumption ASM (the proposition) as the truth, and may compute the parameter R and the open circuit voltage $V_{EST}(t)$ (the estimation equation of the open circuit voltage $V_{EST}(t)$ can be changed from the above equation (A4)).

Figure 16:
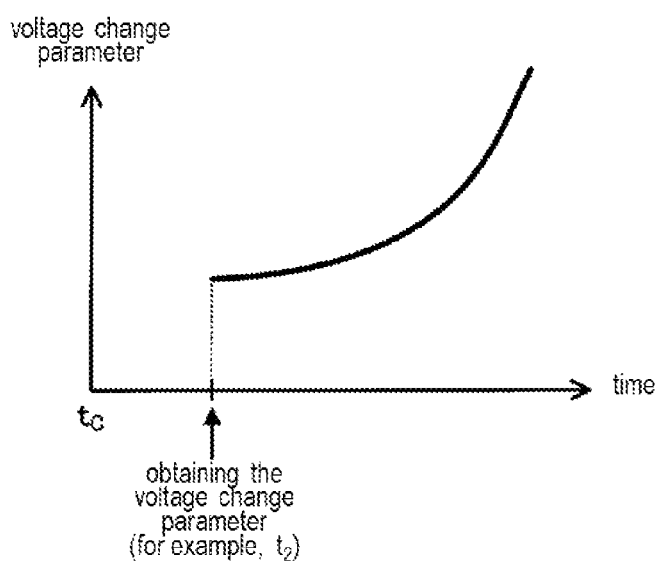
FIG. 16 is a figure showing a time dependability of a voltage change parameter related to the seventh example of the present invention.

When the voltage change parameter does not depend on the time, the estimated open circuit voltage $V_{EST}(t)$ according to the above equation (A4) continues changing as the time elapses. Even in such a case, when the object timing t is appropriately set (for example, as mentioned in the first example, the object timing t is set at the time one hour after the timing $t_C$), the estimated open circuit voltage $V_{EST}(t)$ precisely shows the stable open circuit voltage Vs_P2. However, in order that the estimated open circuit voltage $V_{EST}(t)$ converges at the stable open circuit voltage Vs_P2, the voltage change parameter (R, $R_C$, $R_{UPDATE}$, $R_J$, or $R_{JO}$)

may be expressed by a function of time (for example, an exponential function or the like). Namely, for example, after computing or obtaining the voltage change parameter, as shown in FIG. 16, the value of the voltage change parameter may be increased as the time elapses.

The above equation (A4) which is illustrated as the estimated equation of the open circuit voltage, makes the estimated equation using the logarithmic function. However, a style of the estimated equation of the open circuit voltage is arbitrary, and the estimated equation of the open circuit voltage may be made by using functions other than the logarithmic function (for example, exponential functions)

VARIATIONS OR THE LIKE

Several variations of the embodiments of the present invention are possible without departing from the technical scope of the claims. The embodiments described above are examples of embodiments of the present invention, and the meanings of the terms for each configurational requirement of the present invention are not restricted to the descriptions in the embodiments above. Specific numerical values in the text of the descriptions are merely for illustrative purposes, and these can be changed to any other numerical value. Annotations applicable to the embodiments described above are included below in Note 1 through Note 3. The contents of these notes can be combined in any way that is not contradictory.

[Note 1]

In the embodiments described above, the estimation process of the open circuit voltage during the current non-passage period P2 after discharging is stopped, is explained. Further, the estimation process of the open circuit voltage also during the current non-passage period 2 after charging is stopped, is possible.

[Note 2]

The object devices of the battery controlling portion 15, the battery state estimation device 30, or the estimation device 50, 50A, or 50B can be configured of hardware, or a combination of hardware and software. All or a part of the arbitrary specific functions realized using software by the object devices may be stored in a program, and the program is stored in a flash memory incorporated in the object devices and the program executed by a program-executing device (such as a micro-computer incorporated in the object devices) performs the functions. The above program can be stored and fixed in a storage medium (not shown in the figures). The storage medium (not shown in the figures) in which the above program is stored or fixed may be incorporated in the electric device other than the object device (a server computer device or the like).

[Note 3]

It may be considered that the parameter computing portion 54 and the open circuit voltage computing portion 55 constitutes the open circuit estimation portion, or the parameter computing portion 54, the parameter compensating portion 57, and the open circuit voltage computing portion 55 constitutes the open circuit voltage estimation portion (refer to FIG. 5, FIG. 9, FIG. 11). Further, it may be considered that the battery state estimation portion includes the parameter updating portion 60 (refer to FIG. 13). A device which excludes the charging ratio estimating portion 56 from the estimation device 50, 50A, 50B functions as an open circuit voltage estimation device. It is possible to omit the charging ratio estimating portion 56 from the estimation device 50, 50A, 50B.

The invention claimed is:

1. A battery state estimation device comprising:
a micro-computer; and
a non-transitory memory storing a program, wherein:
the program, when executed by the micro-computer, causes the micro-computer to function as:
a measured value obtaining portion obtaining measured values of the battery voltage as the terminal voltage of a storage battery in order;
a timing setting portion which sets, during electrical current non-passage after charging or discharging of the storage battery is stopped, a reference timing, a first timing at which battery voltage changes by a predetermined unit amount with respect to the reference timing, and a second timing at which the battery voltage changes further by the predetermined unit amount, by using the measured value of the battery voltage; and
an open circuit voltage estimation portion which includes a parameter computing portion which obtains a parameter corresponding to a rate of change of a change speed of the battery voltage during the electric current non-passage, and estimates an open circuit voltage of the storage battery by using the parameter at an object timing after the second timing based on a ratio R of a second time difference between the first and the second timing to a first time difference between the reference timing and the first timing, and
the open circuit voltage estimation portion estimates the open circuit voltage at the object timing, by regarding, during the electrical current non-passage, that a time length during which the battery voltage changes by the predetermined unit amount becomes R times as the previous time length every time the battery voltage changes by the predetermined unit amount.

2. The battery state estimation device according to claim 1,
wherein the open circuit voltage estimation portion further comprises a parameter compensating portion which compensates the parameter computed by the parameter computing portion by an index for compensation, and the open circuit voltage is estimated at the object timing by using the parameter after the compensation, and
the index for the compensation includes at least one of
a temperature of the storage battery,
a charging or discharging current rate of the storage battery during electrical current passage of charging or discharging the storage battery,
a change value of charging ratio of the storage battery during the electrical current passage, and
the charging ratio of the storage battery during the electrical current non-passage.

3. The battery state estimation device according to claim 1,
wherein the timing setting portion sets the reference timing based on elapsed time after charging or discharging is stopped, or change value of the battery voltage after charging or discharging is stopped.

4. The battery state estimation device according to claim 1,
further comprising a measured value holding portion which holds the measured voltage values for more than a predetermined time after charging or discharging of the storage battery is stopped, wherein after the timing setting portion sets a timing when the predetermined time after charging or discharging of the storage battery is stopped elapses as the second timing, the timing setting potion sets the reference timing and the first timing with reference to the second timing by using holding contents of the measured value holding portion.

5. The battery state estimation device according to claim 1, wherein the timing setting portion sets an updating reference timing after the reference timing during the electrical current non-passage, and sets an updating first timing when the battery voltage changes by the first voltage value from the updating reference timing, and an updating second timing when the battery voltage changes by the second voltage value from the updating reference timing, by using the measured value, and further the open circuit voltage estimation portion comprises the parameter updating portion which updates the parameter obtained by using the first and the second time difference based on a time difference between the updating reference timing and the updating first timing, and a time difference between the updating first timing and the updating second timing, and estimates the open circuit voltage at the object timing by using a parameter after updating.

6. The battery state estimation device according to claim 1, further comprising a charging ratio estimating portion which estimates the charging ratio of the storage battery based on an estimated open circuit voltage by the open circuit voltage estimation portion.

7. A storage battery system comprising:

a storage battery; and the battery state estimation device according to claim 1.

* * * * *